United States Patent
Reddy

(10) Patent No.: US 7,742,577 B1
(45) Date of Patent: Jun. 22, 2010

(54) TONE AROUND TEST ADAPTER

(75) Inventor: Christopher C. Reddy, Virginia Beach, VA (US)

(73) Assignee: Verizon Corporate Services Group Inc., Basking Ridge, NJ (US)

( * ) Notice: Subject to any disclaimer, the term of this patent is extended or adjusted under 35 U.S.C. 154(b) by 1235 days.

(21) Appl. No.: 10/864,411

(22) Filed: Jun. 10, 2004

Related U.S. Application Data

(60) Provisional application No. 60/477,280, filed on Jun. 10, 2003.

(51) Int. Cl.
H04M 1/24 (2006.01)
H04M 3/08 (2006.01)
H04M 3/22 (2006.01)
G01R 19/00 (2006.01)

(52) U.S. Cl. ............... 379/21; 379/22.03; 379/22.07; 379/27.03; 324/66

(58) Field of Classification Search ............... 324/66; 379/21, 22.03, 22.07, 27.03
See application file for complete search history.

(56) References Cited

U.S. PATENT DOCUMENTS 4,186,283 A * 1/1980 Simmonds ............... 379/21
4,496,801 A * 1/1985 Roberts et al. ............ 324/66

* cited by examiner

*Primary Examiner*—Ahmad F Matar
*Assistant Examiner*—Nafiz E Hoque

(57) ABSTRACT

A splicing method and apparatus is provided to facilitate efficient identification of cable wires to be spliced. Multiple wires are coupled to a test circuit, and a test signal is selectively applied to wire pairs with a switch. The wire carrying the signal in the cable to be replaced is then cut and spliced to a corresponding wire in a replacement cable.

16 Claims, 12 Drawing Sheets

TONE AROUND TEST ADAPTER

REFERENCE TO PENDING PRIOR APPLICATION

This patent application claims benefit of pending prior U.S. Provisional Patent Application Ser. No. 60/477,280, filed on Jun. 10, 2003 by Christopher C. Reddy for "Tone Around Test Adapter," incorporated by reference herein.

FIELD OF THE INVENTION

This invention generally relates to a testing method, and specifically, to a method for efficiently identifying unmarked cable pairs in a cable during cable splicing.

BACKGROUND OF THE INVENTION

Consumers and businesses rely heavily on telecommunication networks for transmission of data. Telecommunication lines comprise thousands miles of telephone cable. Each cable often includes as many as 3,000 insulated copper wires. When first deployed, transmission line cable wires were insulated with paper pulp, and such pulp insulated wires were used for many years thereafter. Later, in the 1950's, polyethylene insulated (PIC) wires were deployed. Today, pulp-insulated wire cables still carry a significant amount of telecom traffic, although the manufacture of such cables has been discontinued.

Typically, pulp insulated wires have the same color insulation so each is visually indistinguishable. Accordingly, identity particular wires in such cables can be difficult.

Typically, all the wires in a cable are divided into binder groups of twenty five pairs each. In a PIC cable (i.e., a cable including PIC insulated wires), each pair within a binder group has its own color code. For example, white/blue, white/orange, and black/orange are some commonly used color codes in a PIC cable. Typically, in both pulp and PIC cables, each binder group may be identified as a unit with a binder string, a tape, or by twisting wires within a binder group together.

To ensure reliable transmission of data, existing telecommunication cables require continuous maintenance. A common telecommunication cable maintenance routines involves replacement of worn, deteriorated, or damaged sections of cable with new cable sections. Another common maintenance routine involves confirming integrity of the cable section to isolate a defective portion of the cable. Both maintenance routines may require replacement of cable portions by splicing, or joining pieces of cable together. Splicing requires that each wire in one segment of cable be joined with a matching wire in another segment. Due to the extensive deployment of pulp cable, many splicing operations require joining new PIC cable, for example, with pulp cable. In existing telecommunication lines, a maintenance splicing task requires splicing portions of an existing pulp cable and replacing those portions with new PIC cable.

Typically, to insure high quality connections between spliced cables, splicing modules such as the 710 Module commercially available from 3M Corporation are used. Splicing module connectors may contain an insulation displacement connection device enabling simultaneous electrical connection of multiple pairs of two copper conductor cables. Such splicing modules can connect up to twenty-five such pairs at a time. A half-tap connector may be employed to join two cables without cutting the existing cable wires, thereby maintaining service during splicing. Users may also use straight connectors to make a straight or through splice. When a three-way splice is required, a user may incorporate a bridging connector to make an electrical connection between wire pairs in three cables simultaneously.

To identify and match wire pairs, a user may use tone tracing or other electronic identification techniques for each uncolored wire pair in a pulp or PIC cable. Conventional tone tracing test devices include commercially available Throwmaster, Side-Kick, or Dynatel pair testers. Picking one binder group at a time, a user may first attach a test lead to each included wire pair. A test probe including a sensitive amplifier may then be used to detect a tracing tone sent to each pair to identify a matching connection. Once a pair is identified, a matching connection may be made and the test lead is then moved to the next pair. This process is then repeated until all pairs are identified and matched. Since each pair is handled individually, tone testing each wire pair can be a time consuming task. In addition, the tone of the test device may not be detected due to a poor contact between the wires and the test lead. In which case, the test lead is reattached and wire pairs are retested until each is properly identified. Testing wire pairs thus can be a lengthy and complicated process. Moreover, repeated re-connections of the test probe may damage wire insulation, especially in an old pulp cable. It is therefore desirable to provide a method for more efficient, reliable, and less time consuming identification of unmarked cable pairs during cable splicing.

SUMMARY OF THE INVENTION

Consistent with the invention, a telecommunication testing apparatus is provided, comprising a connector having a plurality of first, second, and third ports, a plurality of conductors, and a test circuit. A telecommunication apparatus further comprising a bridging module, configured to be accommodated by a splicing connector is also provided. In addition, a test circuit of the telecommunication testing apparatus may be configured to selectively supply a test signal to one of the conductors. Further, consistent with the invention, a splicing method comprising coupling a plurality of wires to a test circuit, generating a test signal, and supplying the test signal to the plurality of wires is provided.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

The accompanying drawings, which are incorporated in and constitute a part of this specification, illustrate several embodiments of the invention and together with the description, serve to explain the principles of the invention.

DESCRIPTION OF THE EMBODIMENTS

Reference will now be made in detail to the exemplary embodiment of the invention, an example of which is illustrated in the accompanying drawings. Wherever possible, the same reference numbers will be used throughout the drawings to refer to the same or like parts.

Figure 1:
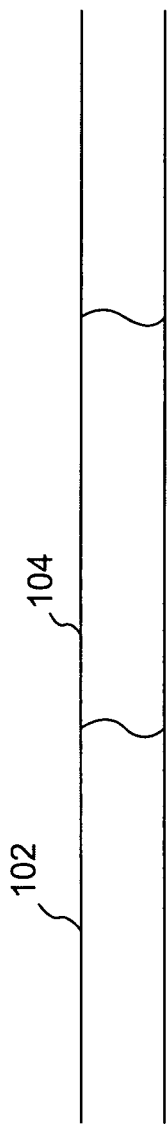
FIG. 1 is an exemplary cable with a damaged or worn portion, which may be bypassed or replaced by a new cable.
Figure 2:
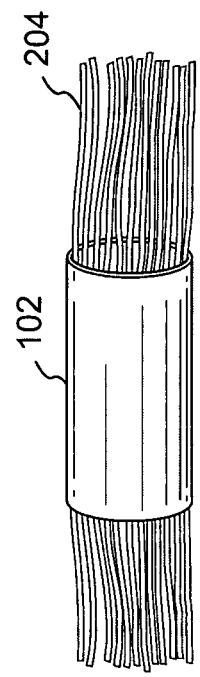
FIG. 2 is an exemplary cable with a damaged or worn portion in greater detail.

FIG. 1 illustrates a cable 102 having a damaged or worn portion 104, which may be bypassed or replaced by a new cable. As seen in FIG. 2, cable 102 is shown in greater detail, including a plurality of wires 204, which are often paired.

Figure 5:
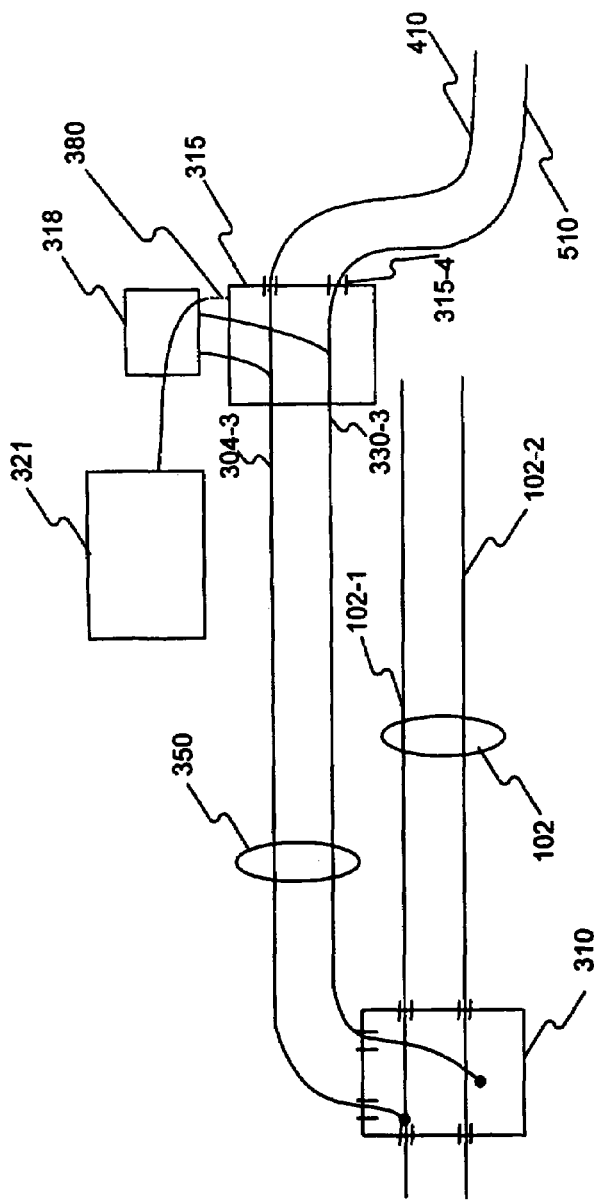
FIG. 5 is an exemplary block diagram depicting connection between cables and bridging modules within telecommunication testing apparatus.
Figure 6:
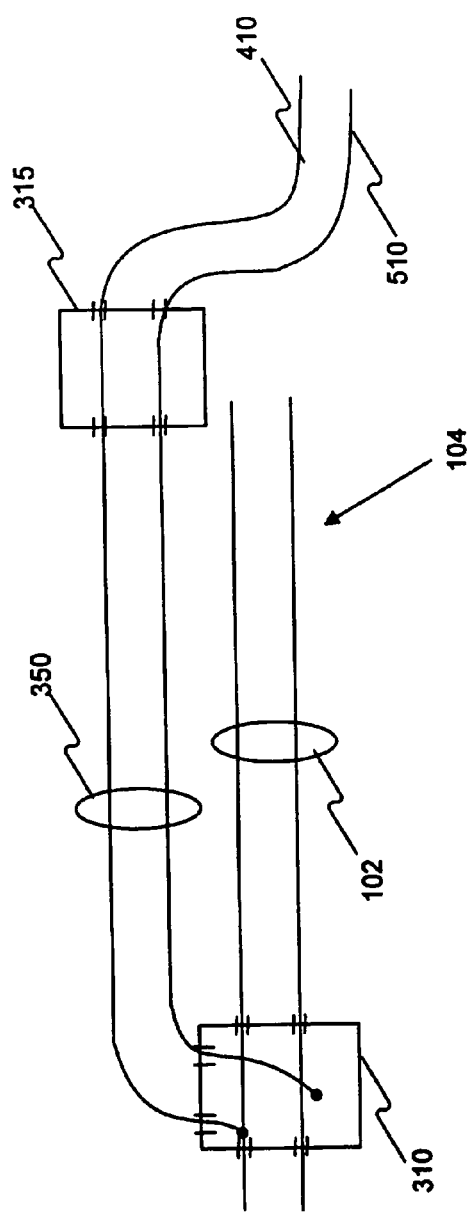
FIG. 6 is an exemplary block diagram depicting connection between cables and bridging modules within telecommunication testing apparatus.
Figure 7:
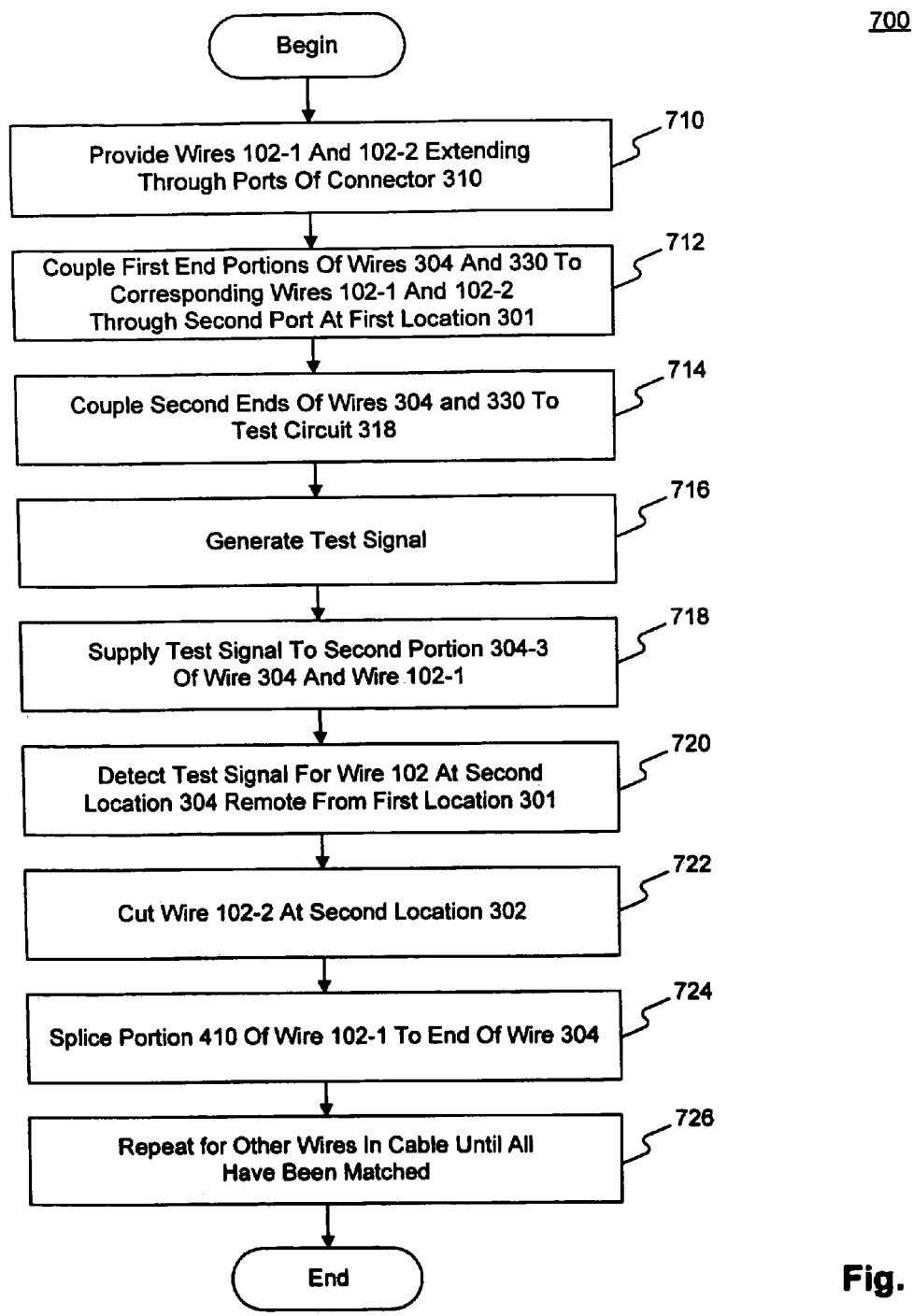
FIG. 7 is an exemplary flow chart for a method of splicing two cables together.

An apparatus for splicing telecommunication wires and cable consistent with an aspect of the present invention will next be described with reference to FIGS. 3-6 in connection with method steps shown in a flow chart in FIG. 7. For illustrative purposes, FIGS. 3-6 show cables having two wires, but it is understood that any suitable wires may be provided and spliced in accordance with aspects of the present invention.

Figure 3:
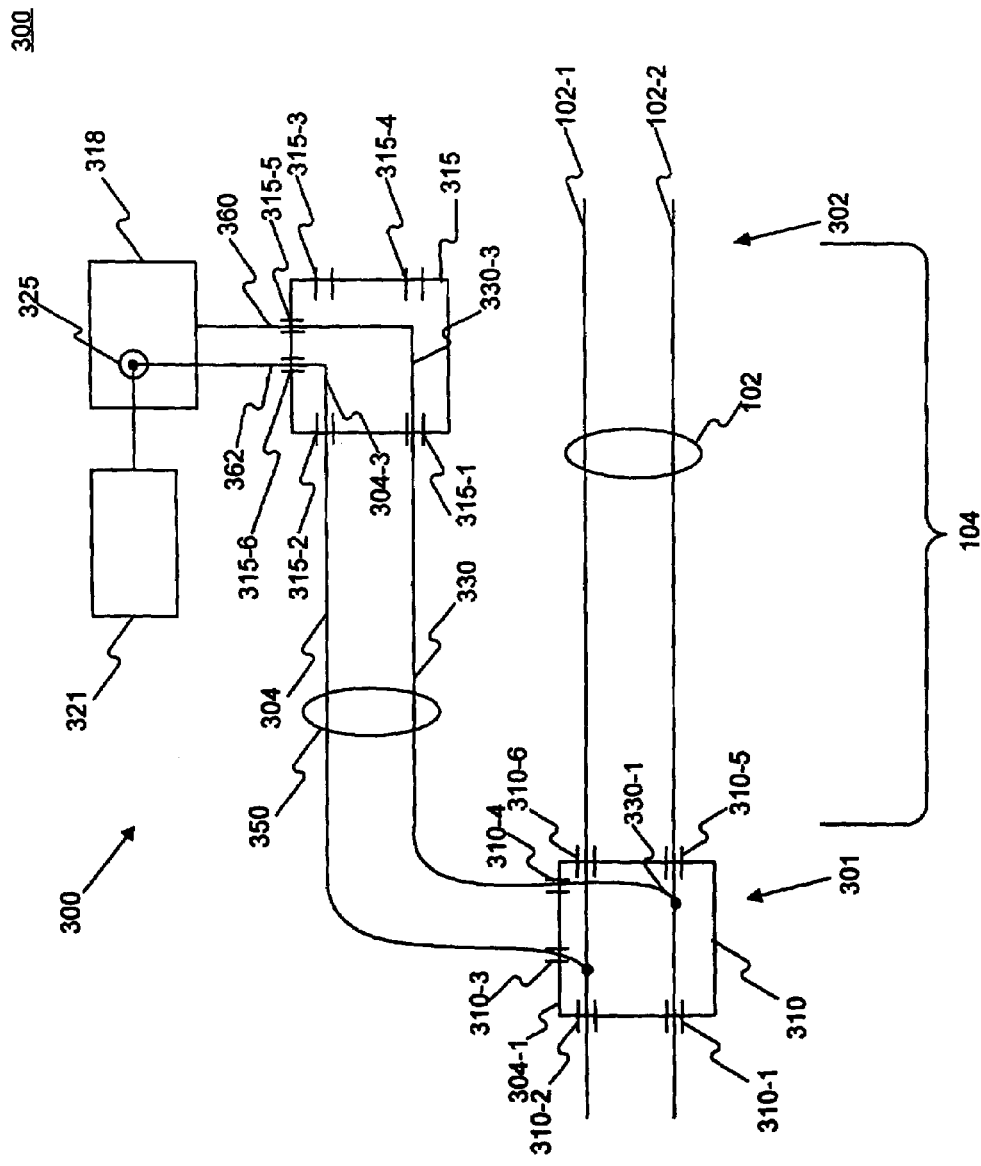
FIG. 3 is an exemplary block diagram depicting connection between cables and bridging modules within telecommunication testing apparatus.

FIG. 3 illustrates a telecommunication apparatus 300 including a connector 310 having first ports 310-1 and 310-2, second ports 310-3 and 310-4, and third pots 310-5 and 310-6. Portions of first wires or conductors 102-1 and 102-2 in cable 102 are provided in connector 310 (see also step 710 in FIG. 7), and extend through ports 310-2/310-6 and 310-1/310-5, respectively at a first location 301. First wire 102-1 further extend to a second location 302. As noted above, in the event section 104 of cable 102 is to be replaced, a second cable 350 having substitute or second wires or conductors 304 and 330 may be provided. To match these wires with corresponding wires in intact portions of cable 102, end portions 304-1 and 330-1 of wires 304 and 330, respectively, may be inserted into corresponding second ports 310-3 and 310-4 so that wire 304 is coupled to wire 102-1 and wire 330 is coupled to wire 102-2 (see step 712).

As further shown in FIG. 3, a test circuit 318 is coupled to wires 304 and 330 and includes a switch 325 for selectively supplying a test signal (often a tone) generated by test signal generator circuit 321 to one of wires 304 and 330. Wires 360 and 362 extend through ports 315-5 and 315-6, respectively, to couple test circuit 318 to end portions 304-3 and 330-3 of wires 304 and 330, respectively (step 714). In FIG. 3, the test signal is generated (step 716) and is supplied from generator circuit 321 to wire 362 via switch 325 and port 315-6 to end portion 304-3 of wire 304 in connector 315. The test signal then propagates along wire 304 and then along corresponding wire 102-1, which is coupled to wire 304 (step 718). The test signal may be sensed with an amplifier in a conventional manner at second location 302 to thereby identifying wire 102-1 at the second location as the wire may be spliced with wire 304 (step 720).

Figure 4:
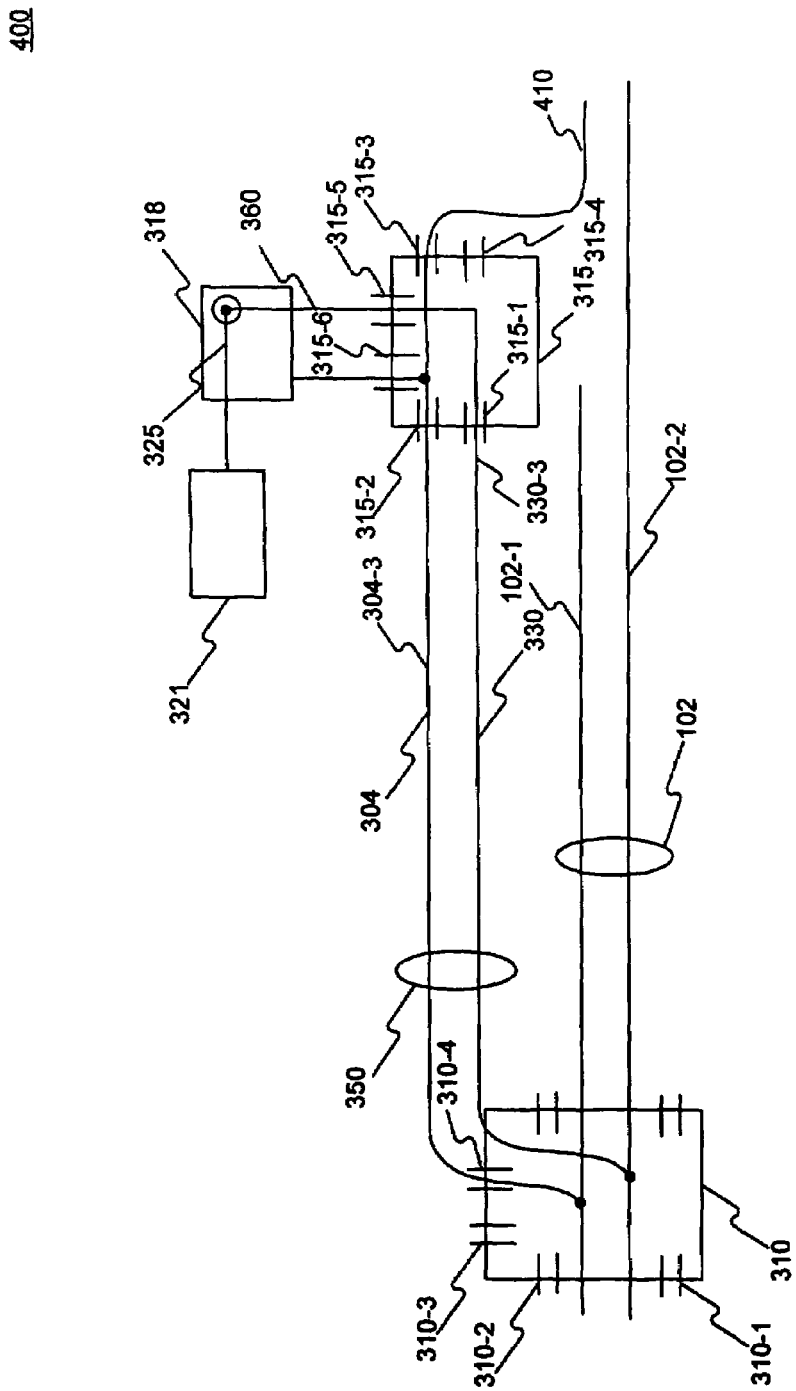
FIG. 4 is an exemplary block diagram depicting connection between cables and bridging modules within telecommunication testing apparatus.

In FIG. 4, wire 102-1 is cut at the second location (step 722), and the remaining piece or section 410 is fed through port 315-3 of connector 315 and spliced to wire 304 in connector 315 (step 724). This process is then repeated for other wires in cables 350 and 102 (step 726).

For example, as further shown in FIG. 4, an electrical connection within test circuit 318 is adjusted, e.g., switch 325 is controlled, to connect to wire 330 through port 315-5. A further test signal is sent from signal generator, through wire 360, to end portion 330-3 and out through port 315-1. The signal next propagates through wire 330 to wire 102-2, where it is detected at the second location to thereby identify wire 102-2 at that location as the wire may be cut and spliced. As a result, as shown in FIG. 5, wire 102-2 is cut, and a remaining portion 510 is fed through port 315-4 and spliced with end portion 330-3 of wire 330. Accordingly, as shown in FIG. 6, connector 310 connects wires in cable 350 to corresponding wires in cable 102, and connector 315 splices wires in cable 350 to appropriate wire portions 410 and 510 of cut cable 102. Cable 102 may also be cut at or near connector 310.

Thus, multiple wires can be coupled to a test circuit, and easily tested by selectively supplying the test signal to a desired wire. The test signal can be sensed so that the wire carrying the test signal can be identified, and then spliced with a corresponding new wire. Accordingly, for example, a damaged section can be bypassed with new cable, and wires in the new cable can be readily matched with appropriate wires in connectors 310 and 315.

Figure 8:
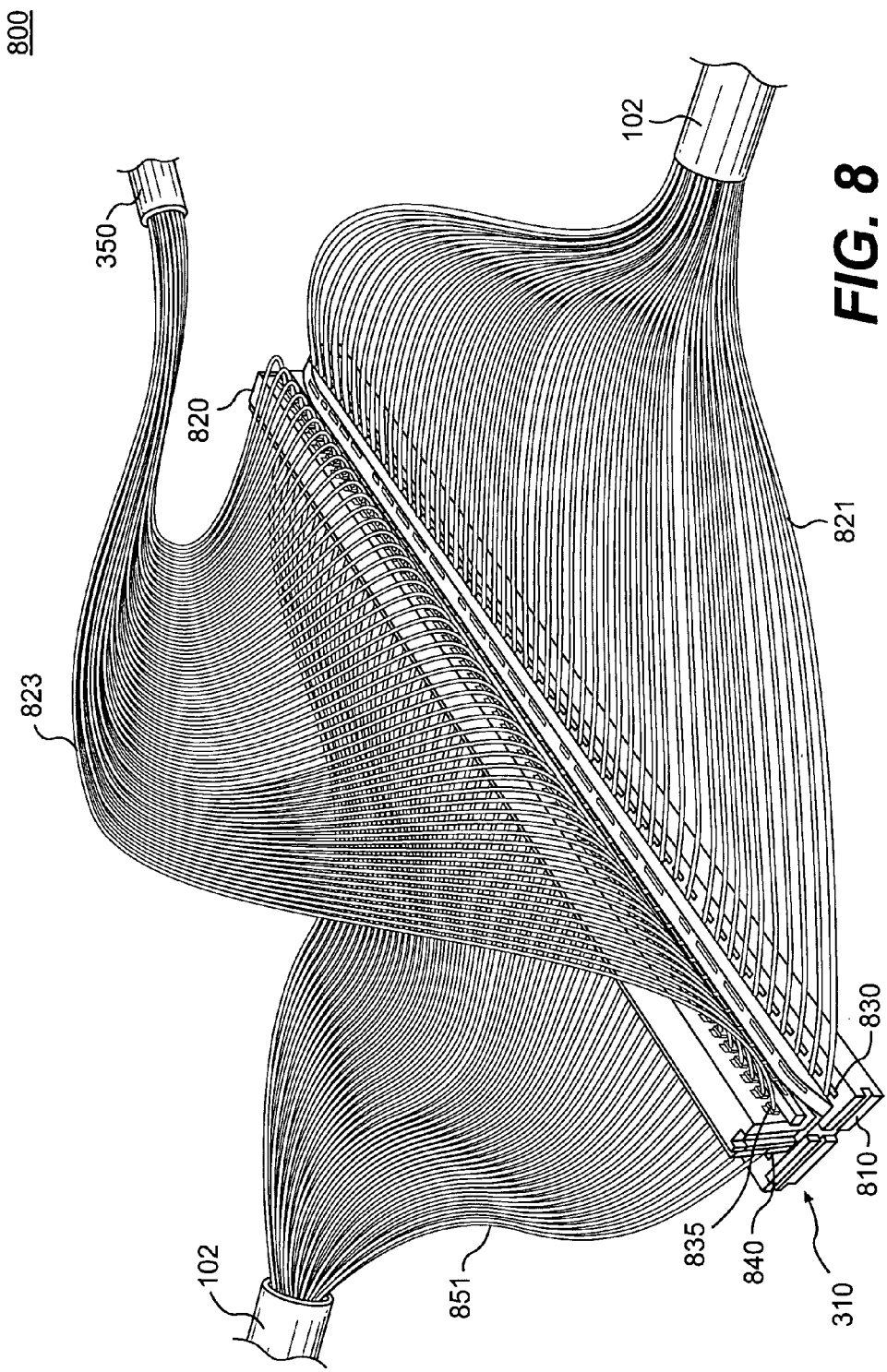
FIG. 8 is an exemplary splicing connector shown with wires attached.

FIG. 8 illustrates connector 310 in greater detail. Connector 310 includes a splicing connector 810, which may be, for example, a 710 splicing rig commercially available from 3M Telecommunications. Wires 821 of cable 102 may be cradled in corresponding ports 830 of splicing connector 810. After all the wires are cradled, a user may use a commercially available cramping tool (not shown) to press end portions of wires 821 into splicing connector 810. During cramping, internal parts of splicing connector 810 (not shown) penetrate insulative sheath 851 of wires 821 making electrical connection with wire conductive portion 870 of wires 821 (see FIG. 10). Similarly, wires 823 of cable 350 may be cradled into a bridging module 820, commercially available from 3M Telecommunication, within corresponding ports 835 for the subsequent cramping and insulation penetration.

Bridging module 820 may be accommodated by or inserted into splicing connector 810. In the example shown in FIG. 8, wires 821 are cut, but insulative sheath 851 may be penetrated inside bridging module 820 to thereby allowing electrical contact with each of wires 823, as discussed in greater detail below.

Figure 9:
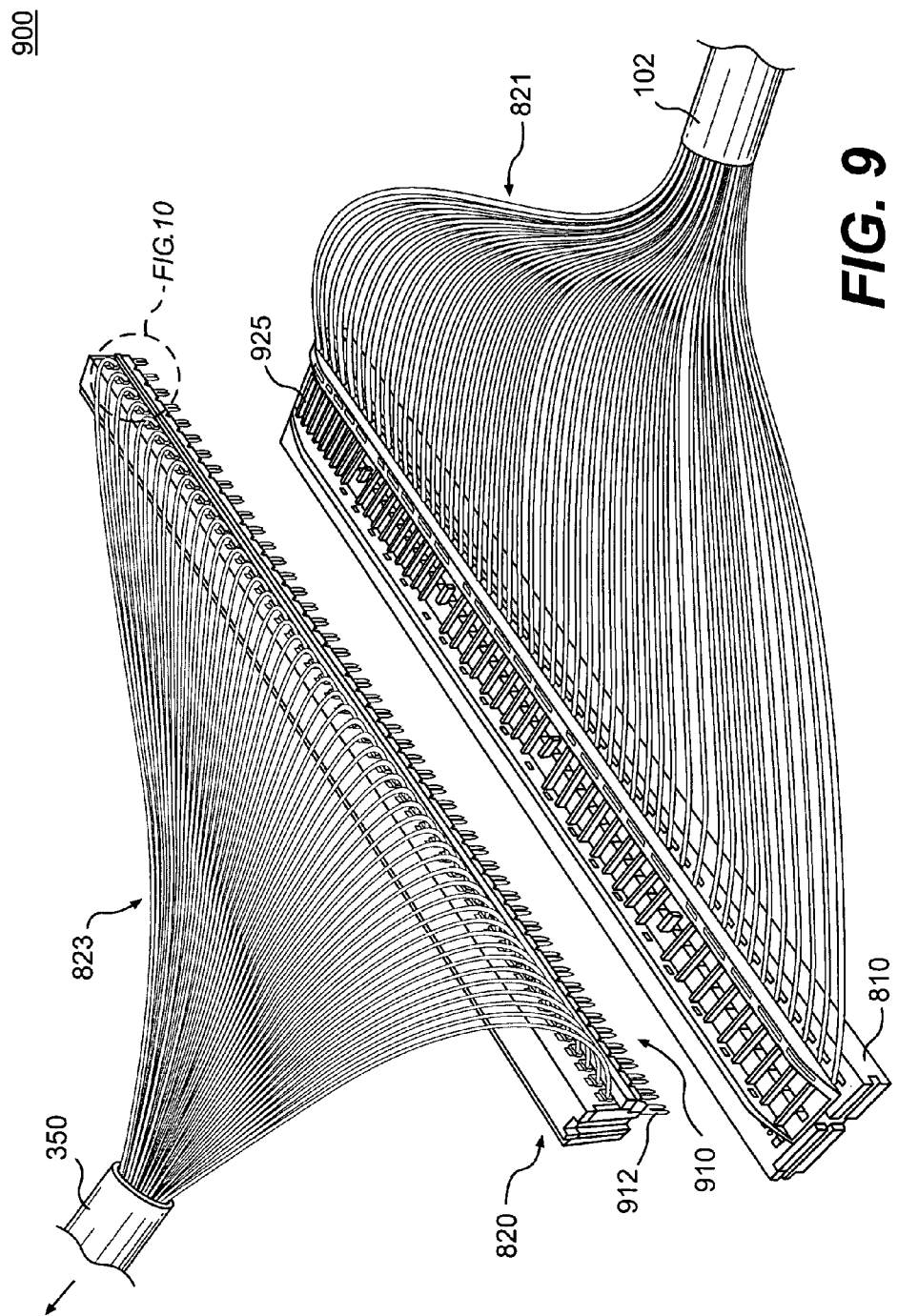
FIG. 9 is an exemplary splicing connector depicted with a bridging module.

FIG. 9 illustrates an exploded view of portions of splicing connector 310 including bridging module 820 and splicing connector 810. Bridging module 820 includes a bridging strip 910 located in a bottom portion thereof, and a plurality of conductors 912, shown in greater detail in FIG. 10. When bridging module 820 is inserted into splicing connector 810, conductors 912 are pressed into corresponding openings 925 of splicing connector 810, through which electrical contact is made with corresponding wire conductors 870.

Figure 10:
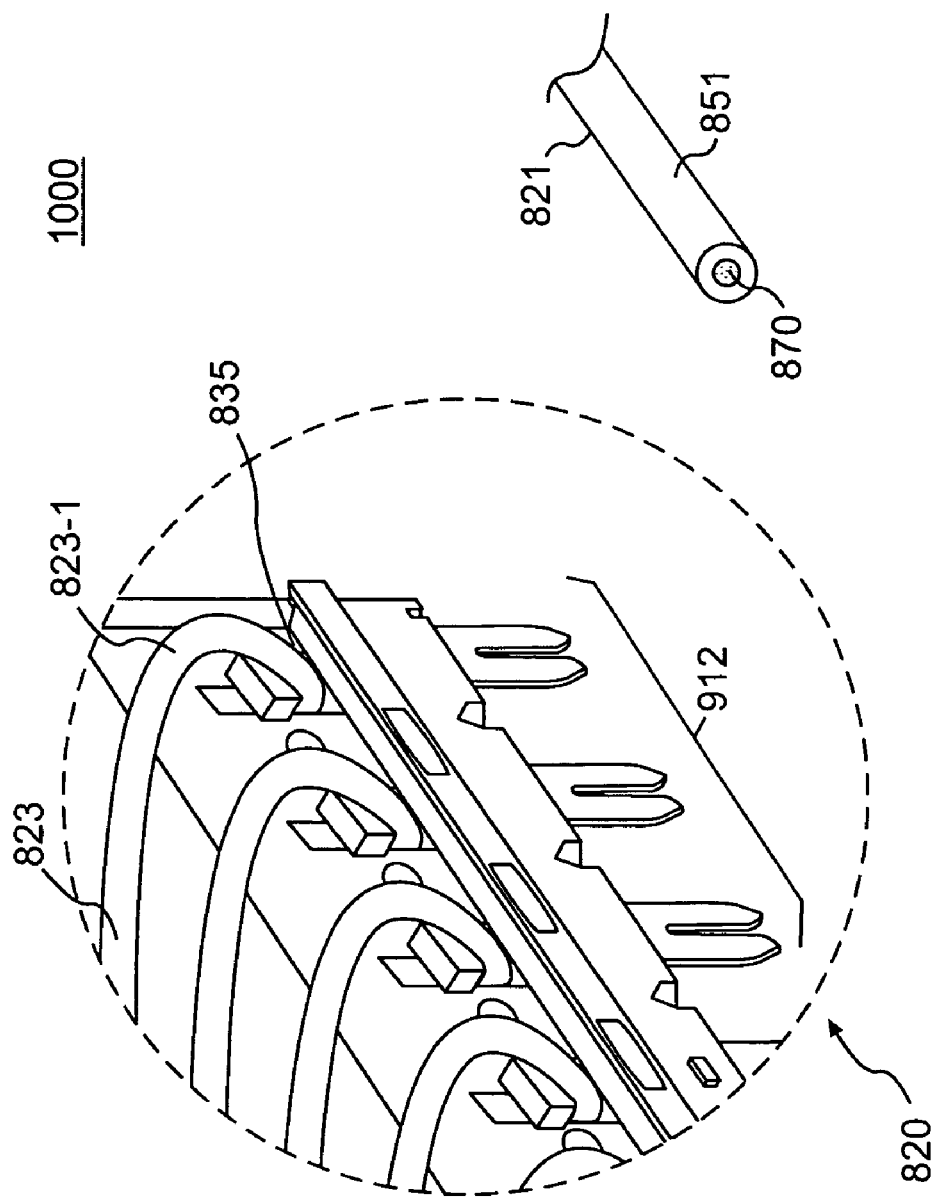
FIG. 10 is an exemplary exploded view of conductors in a bridging module.

In particular, as shown in FIG. 10, end portions 823-1 of wires 823 are fed into ports 835 of bridging module 820. Conductors 912 in bridging module 820 make contact with end portions 823-1. Further, conductors 912 are fork-shaped, for example, and are thus configured to make an electrical contact with a metal bar (not shown) located inside the bridging module 810. The metal bar also has an electrical contact with wires 821 conductors and wire conductors 870. As a result, electrical contact is made with each wire 821. Thus, test signals, as discussed above, can be supplied from a selected one of wires 823, and passed to a respective one of wires 821 through one of conductors 912 interconnecting the two.

Figure 11:
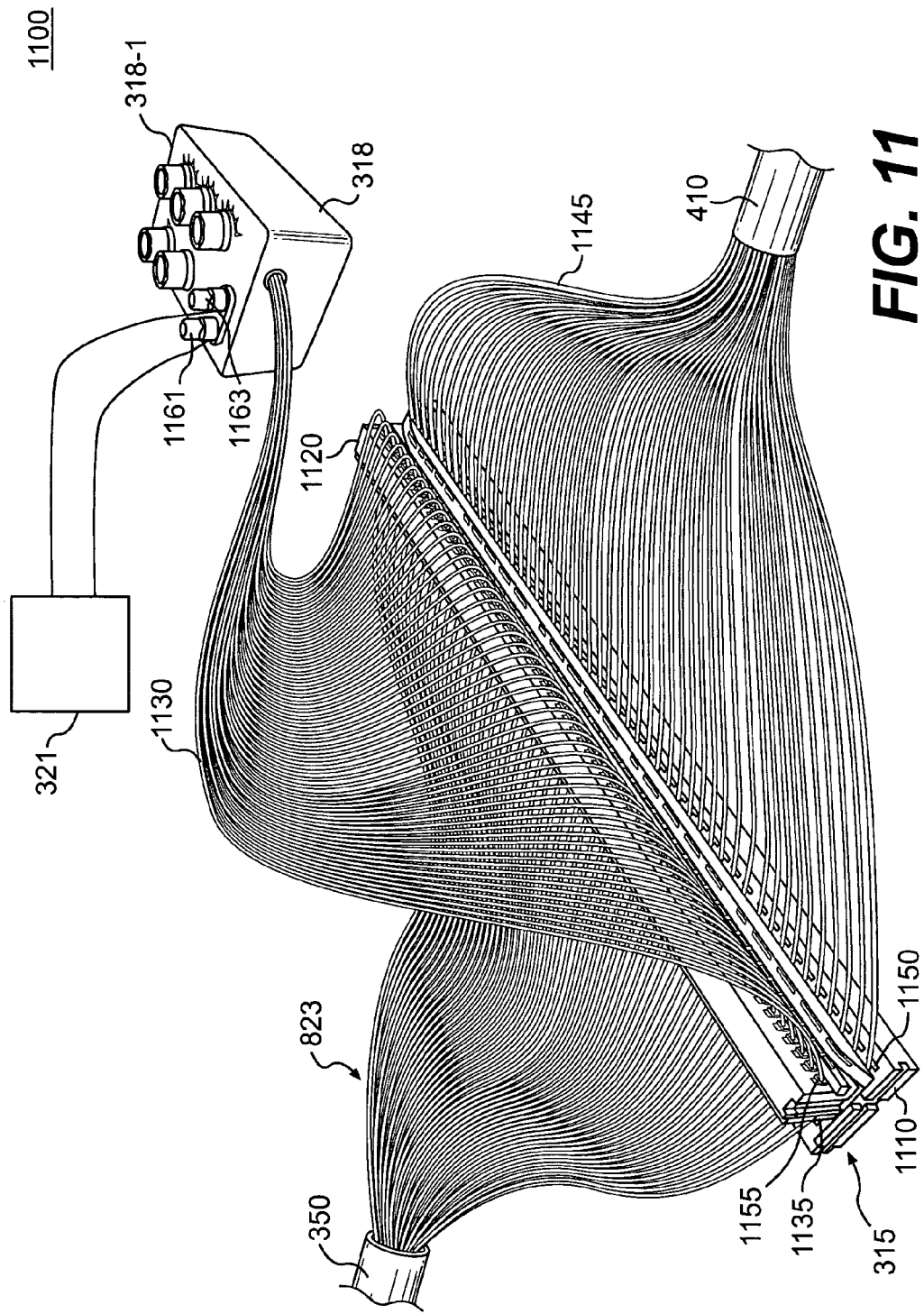
FIG. 11 is an exemplary splicing connector shown with attached test circuit.

FIG. 11 illustrates connector 315 in greater detail. Connector 315 includes a splicing connector 1110 and a bridging module 1120, both of which have a construction similar to that discussed above in regard to splicing connector 810 and bridging module 820. Cut end portions of wires 823 are fed into ports 1135 on one side of splicing connector 1110 and make contact or are spliced within splicing connector 1110 with end portions of wires 1145 of cut cable 410 inserted into respective ports 1150 on another side of the connector. Wires 1130 may be fed through ports 1155 of bridging connector 1120 and make contact within connector 315 through fork-shaped conductors or contacts similar to those discussed above in regard to FIG. 10.

As further shown in FIG. 11, test circuit 318 may be coupled to each of wires 1130, such that a test signal generated by test signal generator circuit 321 can be selectively supplied to a desired wire, or in this example or pair of wires 1130 so that pairs of wires in cable 410, not just individual wires can be identified and matched with pairs of wires in cable 350 in a manner similar to that described above. Thus, in the embodiment shown in FIG. 11, test circuit supplies two test signals through inputs 1161 and 1163 of test circuit 318 instead of a single test signal as discussed above.

Figure 12:
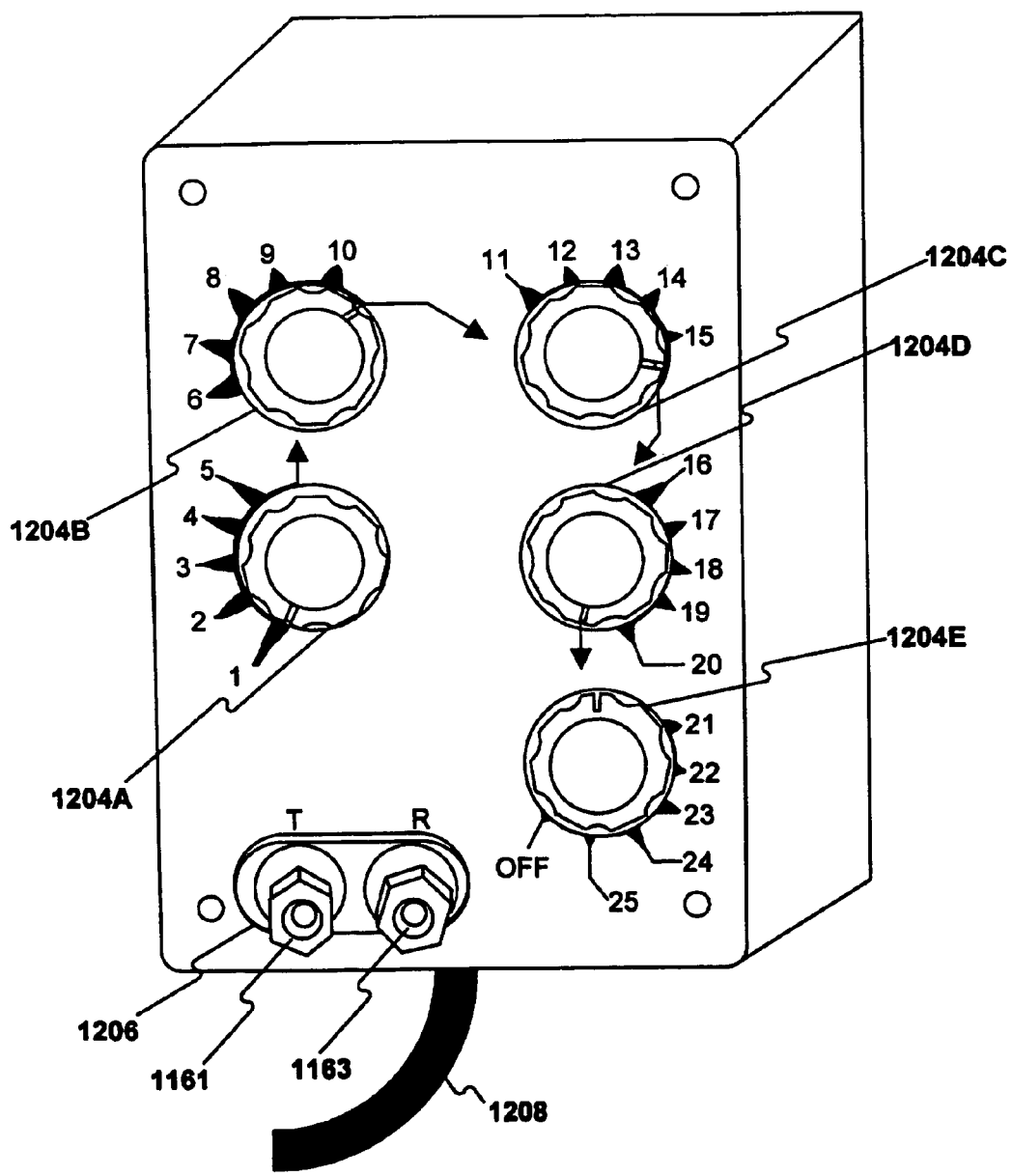
FIG. 12 is an exemplary test circuit for identifying and matching wires.

FIG. 12 illustrates test circuit 1200 in greater detail. Test circuit 1200 may, in the present example, be configured to selectively provide test signals to any one of 25 wire pairs or pairs of wires 1130 (and thus any pair of wires within cables 350 and 102).

Test adapter 1200 may comprise five turn handles 1204A through 1204E and two poles, tone 1161 (T) and ring 1163 (R). Any five-handle twenty-five position rotary switch device may be used. To test each individual set of pairs, a user may attach testing leads of a tone generator (e.g. circuit 321) to T (1161) and R (1163) poles and of test adapter 1200. By turning turn handle 1204A to position No. 1, the tone is supplied on a first pair of wires 1130. Using a test probe, a tracing tone is sent to the matching pair in cable 102 at second location 302 and detected. The wire pair in cable 102 thus may be identified and spliced with a corresponding wire pair in cable 350 in connector 315. By sequentially placing turn handles 1204A through 1204E to positions 2 through 25, a user may readily establish an electrical connection with each pair individually, one at a time, for subsequent testing, identifying and splicing of matching pairs.

Figure 13:
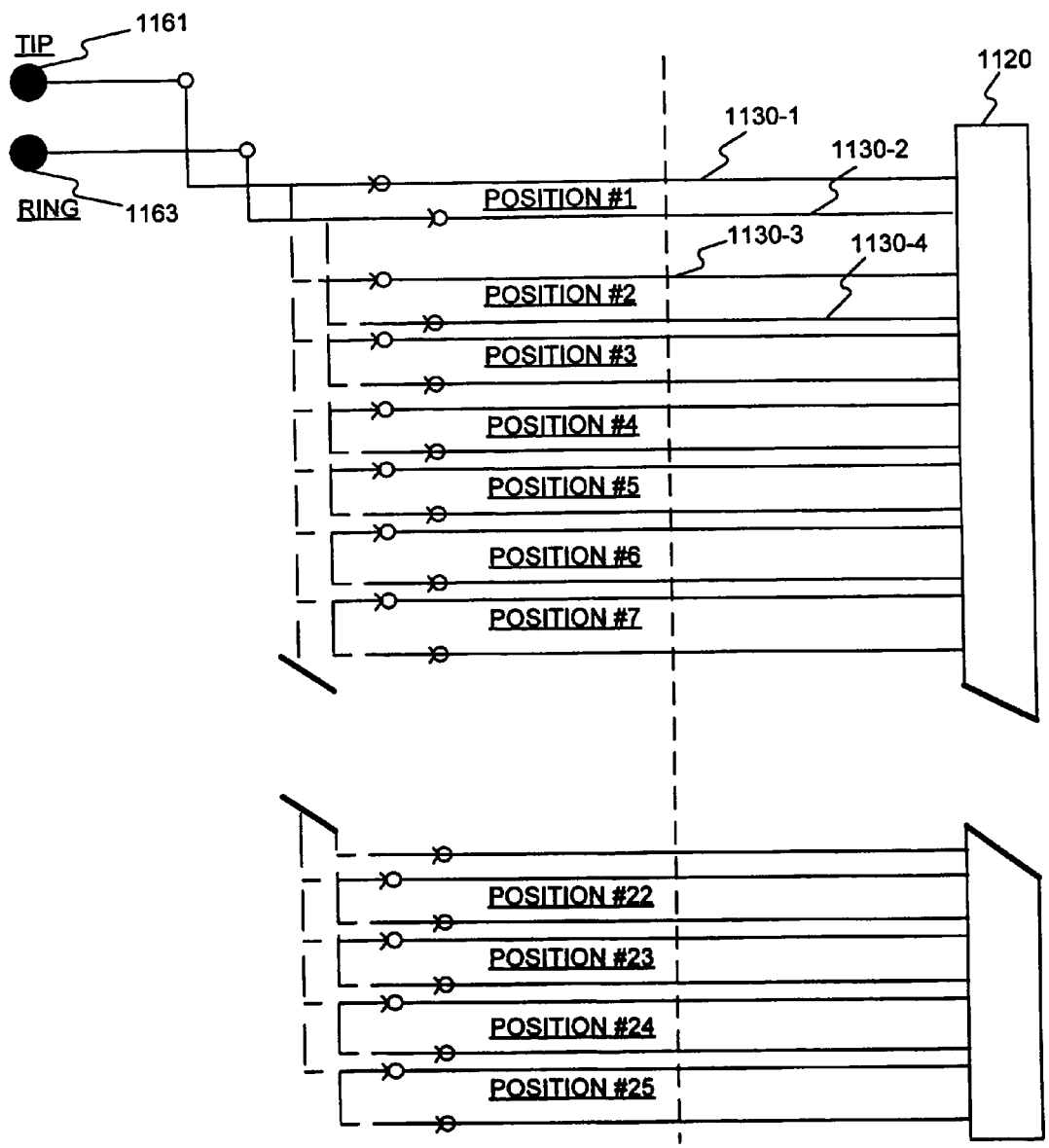
FIG. 13 is an exemplary electrical diagram showing internal wiring of a test circuit.

FIG. 13 is an exemplary schematic of a circuit 1300. As shown in FIG. 13, the end of each of the wire 1130 may be electrically coupled to bridging module 1120 by turning handles 1204A through 1204E of test adapter 1200, as discussed above. For example, upon turning handles 1204A thru 1204E into position No. 1, tip 1161 of test adapter 1200 is electrically connected to the first port 1155 of module 1110 through conductor 1130-1, while ring 1163 of test adapter 1200 is electrically coupled to the second port 1155, for example, of module 1110 through conductor 1130-1. At that time, no other wires 1130 are electrically connected to test adapter 1200. After electrical connection between tip 1161, ring 1163, and module 1120 is made, an electrical tracing signal from a tone generator may be sent to the matching pair in cable 102 at second location 302 and detected for subsequent spicing as discussed above.

After the first matching pair is identified and spliced handle 1204A of test adapter 1200 may be turned into position No. 2, thereby coupling wires 1130-3 and 1130-4 to the third and forth ports 1155 of module 1120, respectively. Then the above described testing procedure may be repeated for each remaining position at turn handle 1204A and positions 3-25 turn handle 1204B-E to thereby test all 25 wire pairs for identification and splicing.

Other embodiments of the invention will be apparent to those skilled in the art from consideration of the specification and practice of the invention disclosed herein. For example, any appropriate number of wire pairs, not just 25, may be identified and spliced consistent with the embodiments described herein. In addition, numerical or color designations may be provided on bridge connector 1120 corresponding to the numbered positions displayed on test adapter or module 1200 to assist in wires to be spliced. It is intended that the specification and examples be considered as exemplary only, with a true scope and spirit of the invention being indicated by the following claims.

What is claimed is:

1. A telecommunication apparatus, comprising:
a first connector having a plurality of first ports, a plurality of second ports, and a plurality of third ports, a different one of a first plurality of conductors extending through a respective one of said plurality of first ports of said first connector and a respective one of said plurality of third ports of said first connector, said first plurality of conductors extending from a first location to a second location;
a second plurality of conductors each having a first end portion and a second end portion, a different one of said first end portions of said second plurality of conductors extending through a corresponding one of said plurality of second ports of the first connector and being coupled to a respective one of said first plurality of conductors at said first location;
a second connector, the second connector having a plurality of first ports, a plurality of second ports, and a plurality of third ports, a different one of the second plurality of conductors extending through a respective one of said first ports of said second connector, wherein said second connector is receives an end portion of a cut piece of a selected one of said first plurality of conductors at said third ports of said second connector; and
a test circuit coupled to said second end portions of said second plurality of conductors through said plurality of second ports of said second connector, said test circuit supplying a test signal to one of said second end portions of said second plurality of conductors, such that said test signal propagates through said one of said second plurality of conductors and to one of said first plurality of conductors coupled to said one of said second plurality of conductors at said first location, said signal being detectable in said one of said first conductors at a second location remote from said first location to thereby identify said one of said first plurality of conductors.

2. A telecommunication apparatus in accordance with claim 1, wherein said test signal includes a tone.

3. A telecommunication apparatus in accordance with claim 1, wherein said test circuit selectively supplies said test signal to an additional one of said second plurality of conductors.

4. A telecommunication apparatus in accordance with claim 3, wherein said test circuit includes a switch to selectively direct said test signal to an additional one of said second plurality of conductors.

5. A telecommunication apparatus in accordance with claim 4, wherein said switch is a rotary switch.

6. A telecommunication apparatus in accordance with claim 1, wherein each of said first plurality of conductors and said second plurality of conductors includes a wire.

7. A telecommunication apparatus in accordance with claim 1, further comprising:
a third plurality of conductors each having a first end portion and a second end portion, a different one of the third plurality of conductors extending through a respective one of said plurality of second ports of said second connector, a different one of said first end portions of said third plurality of conductors being coupled to a corresponding one of said second end portions of said second plurality of conductors at said second connector and each of said second end portions of said third plurality of conductors being coupled to said test circuit.

8. A telecommunication apparatus in accordance with claim 7, wherein said second connector further comprises:
a splicing connector receiving said second end portions of said plurality of second conductors, said plurality of first ports of said second connector being provided in said splicing connector; and
a bridging module, said splicing connector accommodating said bridging module, said plurality of second ports of said second connector being provided in said bridging module, said bridging module receiving a corresponding one of said first end portions of said third plurality of conductors at said plurality of second ports of said second connector, said bridging module having a plurality of conductor elements, a different one of which coupling a different one of said first end portions of said third plurality of conductors to a corresponding one of said second end portions of said second plurality of conductors when said bridging module is accommodated by said splicing connector.

9. A telecommunication apparatus in accordance with claim 1, wherein each of said first plurality of conductors are provided within a corresponding one of a plurality of insulative sheaths, and said first connector comprises:
a splicing connector, said pluralities of said first and third ports of said first connector being provided in said splicing connector, said first plurality of conductors extending through said splicing connector via said first and third ports of said first connector; and
a bridging connector, said splicing connector accommodating said bridging connector, said second ports of said first connector being provided in said bridging connector, said bridging connector receiving said first end of said second plurality of conductors portions via said plurality of second ports of said first connector, said bridging connector having a plurality of conductive elements, a different one of which contacting a corresponding one of said first plurality of conductors through a corresponding one of said plurality of insulative sheaths to thereby contact a corresponding one of said first end portions of said second plurality of conductors when said bridging connector is accommodated by said splicing connector.

10. A telecommunication apparatus in accordance with claim 9, wherein each of said conductive elements includes a fork shaped member.

11. A telecommunication apparatus in accordance with claim 8, wherein said splicing connector receives the end portion of the cut piece of the selected one of said first plurality of conductors.

12. A telecommunication testing apparatus, comprising:
a first bridging module accommodated by a first splicing connector;
a first plurality of conductors extending through said first bridging module;
a second plurality of conductors each having a first end portion and a second end portion, said first bridging module receiving said plurality of first end portions of said second plurality of conductors; and
a test circuit, said test circuit being coupled to each of said second end portions of said second plurality of conductors using a connector having a second bridging module accommodated by a second splicing connector, said test circuit selectively supplying a test signal to one of said second end portions of one of said second plurality of conductors, wherein said second splicing connector receives an end portion of a cut piece of a selected one of said first plurality of conductors.

13. A telecommunication testing apparatus, in accordance with claim 12, further comprising a test signal generator coupled to said test circuit.

14. A telecommunication test apparatus in accordance with claim 12 wherein said test signal includes a tone.

15. A telecommunication test apparatus in accordance with claim 12, wherein said test circuit includes a switch to selectively direct said test signal to said one of said second end portions of one of said second plurality of conductors.

16. A telecommunication test apparatus in accordance with claim 15, wherein said switch includes a rotary switch.

* * * * *